United States Patent [19]

Bartholet et al.

[11] 4,326,115
[45] Apr. 20, 1982

[54] CONTINUOUS THRU-WIRE WELDING MACHINE

[75] Inventors: Stephen J. Bartholet, Orange; Paul J. Chvostal, Buena Park, both of Calif.

[73] Assignee: Odetics, Inc., Anaheim, Calif.

[21] Appl. No.: 169,996

[22] Filed: Jul. 18, 1980

[51] Int. Cl.³ .................... B23K 11/16; B23K 11/32
[52] U.S. Cl. ................. 219/56.1; 219/86.25; 228/4.5
[58] Field of Search ............ 219/56.1, 56.21, 56.22, 219/78.01, 78.02, 86.1, 86.25; 228/4.5, 233, 237, 243, 904

[56] References Cited

U.S. PATENT DOCUMENTS

| | | | |
|---|---|---|---|
| 2,122,933 | 7/1938 | Eckman | 219/86.25 |
| 2,460,807 | 2/1949 | Chanowitz | 219/56.1 |
| 2,852,755 | 9/1958 | Martines | 219/56.1 X |
| 3,384,283 | 5/1968 | Mims | 228/904 X |
| 3,431,388 | 3/1969 | Hamilton | 219/56.21 X |
| 3,627,970 | 12/1971 | Weatherman et al. | 219/56.1 X |
| 3,643,321 | 2/1972 | Field et al. | 228/4.5 X |
| 4,109,846 | 8/1978 | Pennings et al. | 228/4.5 |
| 4,239,144 | 12/1980 | Elles et al. | 219/56.21 X |
| 4,266,710 | 5/1981 | Bilane et al. | 219/56.1 X |

FOREIGN PATENT DOCUMENTS 999354 1/1952 France .................. 219/86.25
75212 8/1970 German Democratic Rep. .

Primary Examiner—J. V. Truhe
Assistant Examiner—Keith E. George
Attorney, Agent, or Firm—Philip M. Hinderstein

[57] ABSTRACT

A continuous thru-wire welding machine for welding a conductor to a terminal comprising a stationary support, first and second elongate arms having known weights, a pair of flexible plates for pivotally connecting first ends of each of the first and second arms to the stationary support with the arms being positioned in parallel, spaced, vertically aligned relationship, an electrode housing, a pair of flexible plates for connecting second ends of the first and second arms to the housing, a first conductive electrode mounted within the housing, the terminal being positionable below the electrode, and a structure for releasably supporting the arms with the first electrode spaced from the terminal, the supporting structure being adapted to release the arms whereby the weight of the arms moves the first electrode into contact with the terminal, the weight of the arms determining the force applied by the first electrode to the terminal.

8 Claims, 4 Drawing Figures

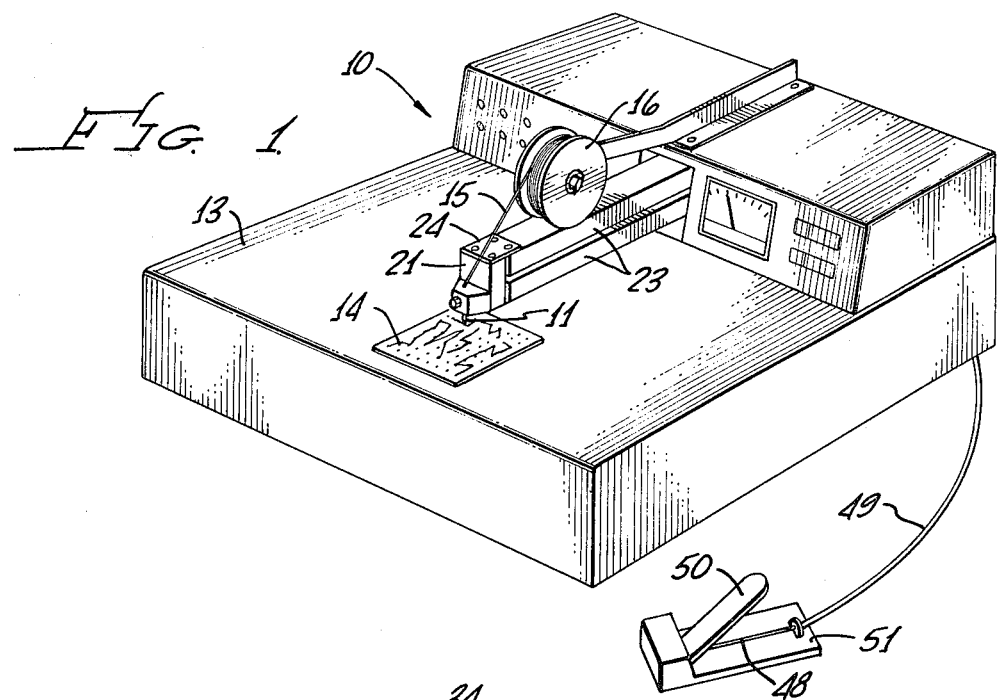
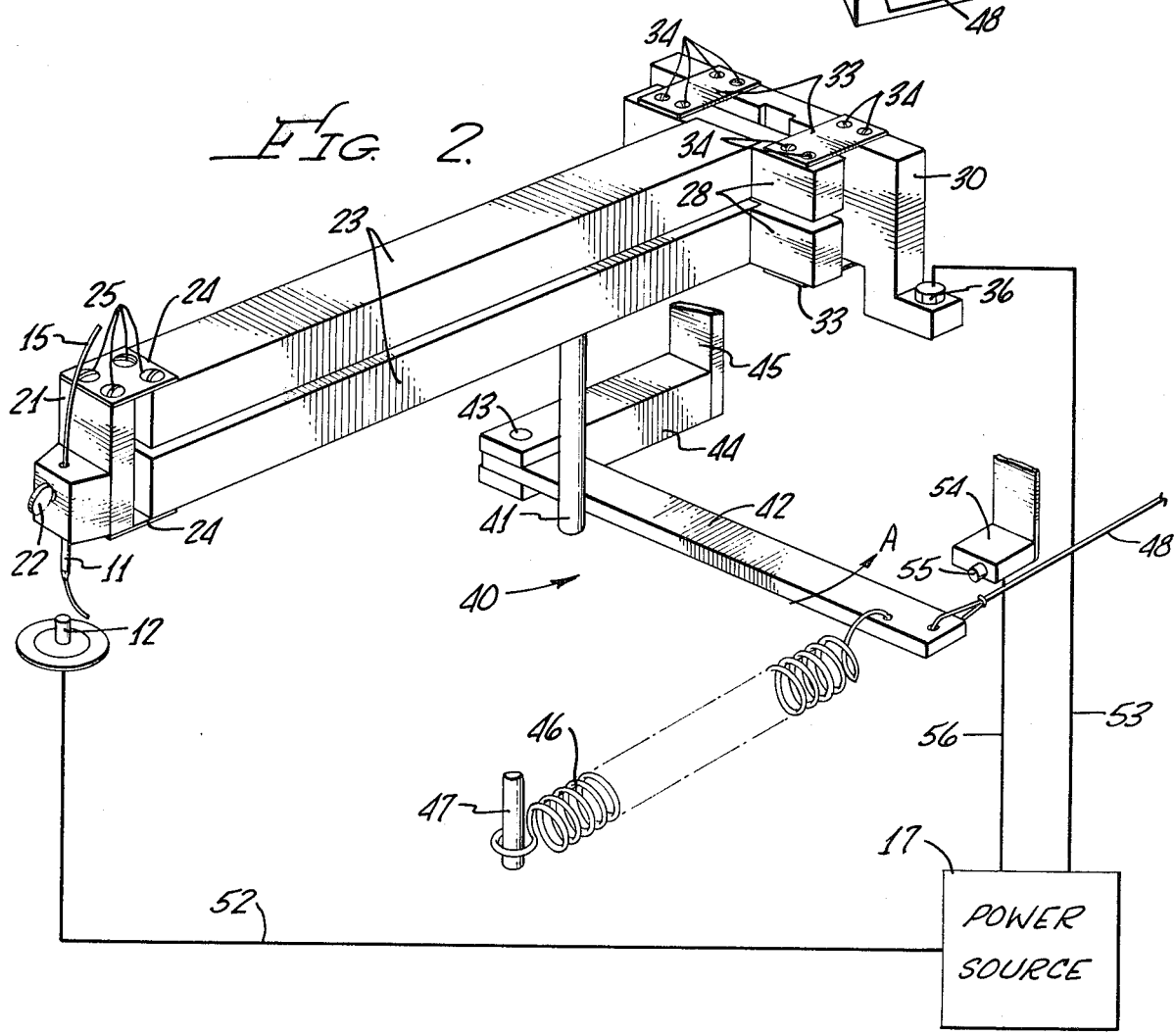

CONTINUOUS THRU-WIRE WELDING MACHINE

BACKGROUND OF THE INVENTION

1. Field of the Invention

The present invention relates to a continuous thru-wire welding machine and, more particularly, to a welding machine using flexure pivots and a dead weight principle for accurately controlling the welding force.

2. Description of the Prior Art

Complex electronic assemblies include large numbers of closely spaced, miniature terminals which must be electrically interconnected. This is often achieved simply and conveniently by the use of a continuous insulated wire, typically nickel coated with teflon. As is known in the art, the continuous insulated wire is snaked to individual terminal locations without the need of removing the insulation prior to assembling the wire for welding. Rather, advantage is taken of the cold-flow properties of teflon.

Specifically, a pair of elongate conductive electrodes having adjacent ends are mounted for movement towards the terminal. Either the electrodes can be concentric with a dielectric therebetween or the electrodes can be positioned in coaxial, spaced relationship and movable toward and away from each other. Typically, one electrode is hollow and the wire is continuously fed therethrough. When a connection is desired, the electrodes are moved into contact with the terminal. Pressure is applied between the electrode and the terminal to break through the teflon insulation. Thereafter, an electrical pulse is applied to the electrodes, which pulse causes a diffusion bond to occur at the junction of the wire and the terminal. The electrodes are then positioned consecutively to all of the other common points in a given signal string.

During such a process, it is desirable and, in fact, necessary, to accurately control the force on the wire positioned between the terminal and the electrodes. That is, if the force is too low, one does not achieve cold-flow of the teflon insulation and a good bond cannot be achieved. If the force is too high, the electrode will damage the wire. The result is the necessity to control the force within narrow limits. In the past, welding machines have utilized complex and expensive means for varying the pressure between the welding electrodes and the terminals. Furthermore, these machines have proven incapable of providing a repeatable, accurately controllable welding force.

For example, existing electro/pneumatic welding machines typically operate by actuating an electrical solenoid valve that extends upper and lower electrodes through a cable drive system to perform the wire bonding to the terminal. The electrical signal actuates the valve to pressurize a piston connected to cables and pulleys and the opposing electrodes sandwich the terminal and wire between them at a fixed pressure, controlled by a regulator, at which time a microswitch actuates the power supply to bond the wire to the terminal. Such a system is generally reliable, but does have problems associated therewith. Air pressure regulators tend to drift or cycle above and below the adjusted setting. The air pistons have considerable friction which affects the accuracy of the applied force. Furthermore, this system is dependent upon a clean source of air pressure. Contaminated air tends to corrode regulators due to moisture and also carries particles which create leakage across internal seals.

Existing electro/mechanical welding machines typically utilize an electronic servo system tied to a cable/pulley drive that extends upper and lower electrodes. The force level at the moment of bonding is electrically adjusted using potentiometers. The use of air pressure is completely eliminated. Actuator friction is compensated for by the servo system and reaction time is almost instantaneous for consistent force application at the electrode/terminal interface. Such a system is described in U.S. Pat. No. 4,179,597. While it is generally satisfactory for providing a repeatable, accurately controllable welding force, the system is complex and expensive.

A typical mechanical welding machine has a fixed bottom electrode and a movable upper electrode which is lowered using a cable/pulley arrangement. At the time the terminal is locked between the two electrodes, a constant force negator spring is extended to maintain a constant force level to pierce the wire insulation and bond the wire to the terminal. The power supply is fired by closing a microswitch that is actuated after the negator has been uncoiled a fixed distance. Such a system is very simple, but has inherent problems. That is, springs do change loadwise after extensive cycling. Reaction time is slow when force levels change at the weld point. Furthermore, friction levels can be high.

SUMMARY OF THE INVENTION

According to the present invention, there is provided a welding machine which solves these problems in a manner unknown heretofore. According to the present invention, the required force on the insulated wire to pierce the insulation and perform the weld is supplied by a dead weight principle, thus eliminating the problems inherent in the use of tension springs, negator springs, or pneumatic-actuated devices. With the present machine, there are no sliding surfaces, linear or rotary, nor are there any rolling surfaces, there is no need for lubrication, and there is no wear. There is no friction that could add to or subtract from the desired electrode force. There are also no clearances that could allow the movable electrode to wiggle even slightly in the lateral direction.

The advantages of the present design are fully available without the need for precision parts or adjustments. Flexure pivots provide a low resistance path for the welding current to the movable electrode without the need for movable electrical conductors. The applied force is achieved by use of the weight of pivoting arms. Once set, the arm weight never drifts or changes, eliminating the need to periodically check and adjust the welding force.

Briefly, the present welding machine for welding a conductor to a terminal comprises a stationary support, first and second elongate arms having known weights, means for pivotally connecting first ends of the first and second arms to the stationary support with the arms being positioned in parallel, spaced, vertically aligned relationship, an electrode housing, means for connecting second ends of the first and second arms to the housing, a first conductive electrode mounted within the housing, the terminal being positionable below the electrode, and means for releasably supporting the arms with the first electrode spaced from the terminal, the supporting means being adapted to release the arms whereby the weight of the arms moves the first electrode into contact with the terminal, the weight of the arms determining the force applied by the first electrode to the terminal.

OBJECTS, FEATURES AND ADVANTAGES

It is, therefore, an object of the present invention to solve the problems encountered heretofore in providing a highly simplified welding machine having a repeatable, accurately controllable welding force. It is a feature of the present invention to solve these problems by providing a continuous thru-wire welding machine using flexure pivots and a dead weight principle to provide a known, repeatable welding force. An advantage to be derived is the elimination of friction which could add to or subtract from the desired electrode force. A still further advantage is the elimination of free play in a lateral direction. A still further advantage is a minimum precision requirement. Another advantage is a simple and direct electrical path. Another advantage is that once the electrode force is established, it never changes or drifts, eliminating the need to periodic check and adjust the welding force.

Still other objects, features, and attendant advantages of the present invention will become apparent to those skilled in the art from a reading of the following detailed description of the preferred embodiment constructed in accordance therewith, taken in conjunction with the accompanying drawings wherein like numerals designate like parts in the several figures and wherein:

BRIEF DESCRIPTION OF THE DRAWINGS

FIG. 1 is a perspective view of a continuous thru-wire welding machine incorporating the features of the present invention;

FIG. 2 is a diagrammatic perspective view of the operative portions of the welding machine of FIG. 1;

DESCRIPTION OF THE PREFERRED EMBODIMENT

Figure 3:
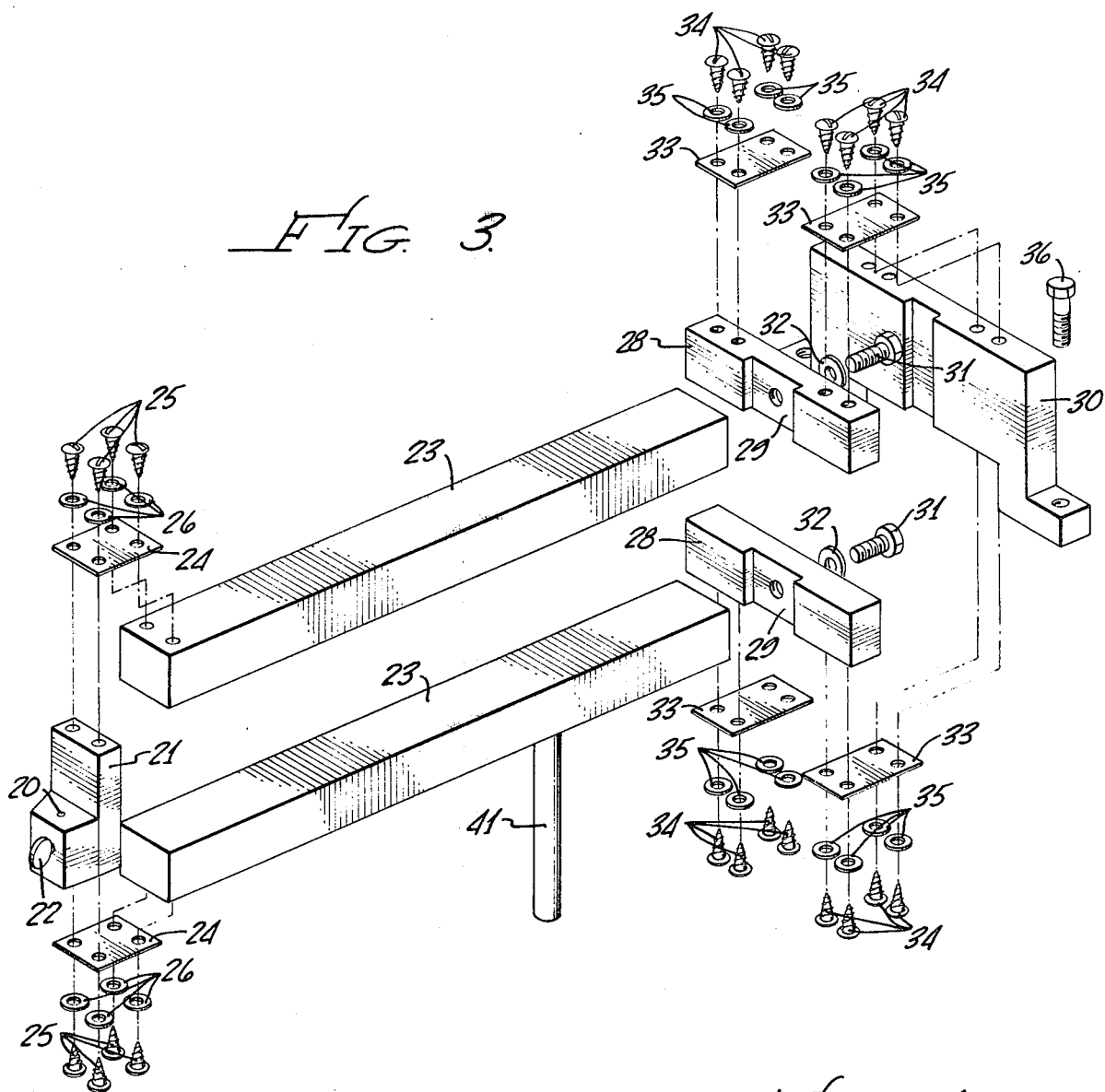
FIG. 3 is an exploded perspective view of the force-producing portions of the present invention.

Referring now to the drawings and, more particularly, to FIGS. 1 and 2 thereof, there is shown a continuous thru-wire welding machine, generally designated 10, having a number of elements common to conventional thru-wire welding machines. Specifically, welding machine 10 includes a pair of elongate conductive electrodes 11 and 12 having adjacent ends mounted for axial movement toward and away from each other. Electrode 12 is mounted in a work table 13 on which may be positioned a circuit board 14 having a number of terminals to be interconnected. The terminals are electrically interconnected by use of continuous insulated wire 15 mounted on a spool 16. Wire 15 may conveniently be nickel coated with teflon. As is known in the art, wire 15 is snaked to individual terminals without the need of removing the insulation prior to assembling the wire for welding.

Electrode 11 is hollow and wire 15 is conducted from spool 16 therethrough. When a connection is desired, electrodes 11 and 12 are moved relative to each other into contact with opposite sides of a terminal on circuit board 14. According to the embodiment of the invention shown in the drawings, electrode 12 is stationary and electrode 11 moves downwardly. Pressure is applied between electrodes 11 and 12 and the terminal to break through the teflon insulation. Thereafter, an electrical pulse is applied to electrodes 11 and 12 from a power supply 17. The electrical pulse causes a diffusion bond to appear at the junction of wire 15 and the terminal. It is the purpose of the present invention to accurately control the force that the electrodes 11 and 12 place on wire 15 and the terminals on circuit board 14.

Figure 4:
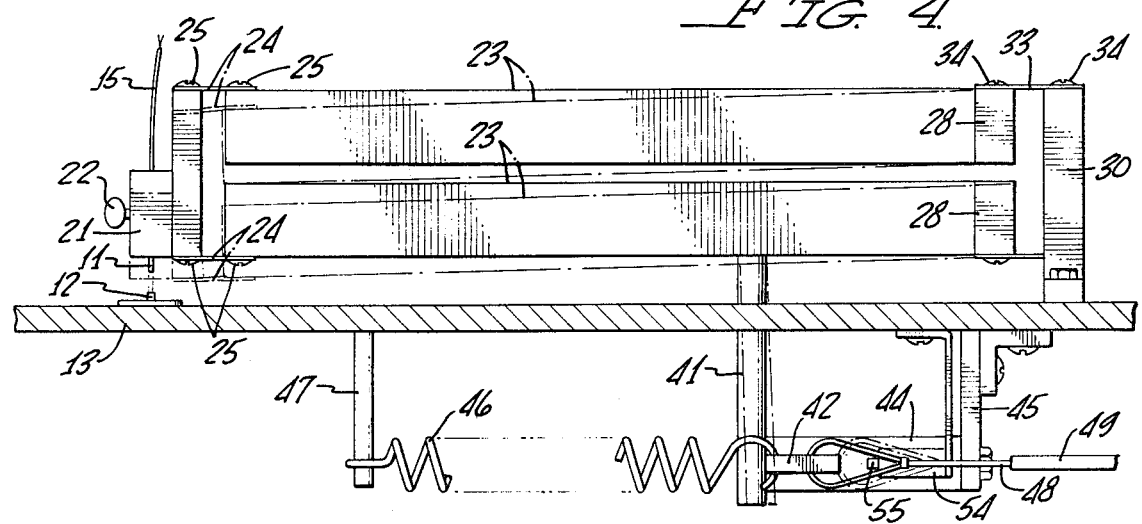
FIG. 4 is a side elevation view of the apparatus shown in FIG. 2.

Referring now particularly to FIGS. 2-4, electrode 11 is mounted within a hole 20 in an electrode housing 21 and held in position therein by a set screw 22. As mentioned previously, electrode 11 is an elongate, hollow, cylindrical member which permits wire 15 to be extended therethrough. Housing 21 is connected to first ends of first and second identical arms or beams 23. Beams 23 are elongate rectangular members, preferably made from steel, each having a known weight, for reasons which will appear more fully hereinafter. Beams 23 are positioned in parallel, spaced, vertically aligned positions.

Housing 21 is connected to beams 23 by means of a pair of upper and lower plates 24, each made from a flexible material such as sheet metal. As can be seen most clearly in FIGS. 2 and 3, plates 24 are connected to beams 23 and housing 21 through the use of a plurality of screws 25 and lock washers 26.

The other ends of beams 23 are connected to a fixed support 30 for pivotal movement relative thereto. More specifically, the other end of each beam 23 is connected to a cross member 28 which is also a generally rectangular, elongate, solid member having a slot 29 in one side thereof for receipt of the other end of beam 23. Alignable holes extend through cross member 28 and beam 23 so that the two members can be interconnected through the use of a bolt 31 and a lock washer 32. Bolts 31 and lock washers 32 form a rigid connection between beams 23 and cross members 28 to prevent relative movement therebetween.

Cross members 28 are connected to support member 30 in the same manner as housing 21 is connected to beams 23. More specifically, a pair of upper and lower flexible plates 33, which are identical to plate 24, are connected to the opposite ends of cross members 28 by means of screws 34 and lock washers 35. The other ends of plates 33 are connected to the upper and lower surfaces of support 30 by additional screws 34 and lock washers 35. The completed assembly is shown in FIG. 2. Support member 30 is connected to work table 13 by means of bolts 36.

The result of the construction just described is that beams 23, cross members 28, housing 21 and electrode 11 are all mounted for pivotal movement relative to support 30 by means of flexible plates 33. Because of the weight of these members, gravity will bring electrode 11 down into contact with electrode 12 or a terminal positioned therebetween with a known, repeatable, unchangeable force. That is, the force that electrode 11 places on a terminal is determined solely and exclusively by the weight of beams 23 and the other movable members connected thereto. Once the various parts just described are connected, the weight never drifts or changes and the welding force remains the same indefinitely. On the other hand, if it is desired to increase the welding force, it would be a simple matter to add trim weights to beams 23, which weights would be locked in place, in some suitable fashion, after calibration.

Welding machine 10 further includes means, generally designated 40, for releasably supporting beams 23 with electrode 11 spaced from electrode 12 so that a circuit board, such as circuit board 14, may be placed therebetween. Support means 40 is adapted to release beams 23 whereby the weight of beams 23 moves electrode 11 into contact with a terminal on circuit board 14, as described previously.

With reference to FIGS. 2 and 4, support means 40 includes a shaft 41 that is rigidly connected to the lower beam 23, shaft 41 extending perpendicular thereto, in a vertically downward direction. Shaft 41 is adapted to contact a lever arm 42, one end of which is connected by means of a pin 43 to a stationary arm 44 connected by means of a bracket 45 to work table 13. The other end of lever arm 42 is connected by means of a spring 46 to a stationary pin 47 also connected to work table 13. Thus, spring 46 biases lever arm 42 with a clockwise rotation, exerting a force to the left as viewed in FIG. 4 on shaft 41. This force on shaft 41 rotates shaft 41 in a clockwise direction, thereby elevating beams 23. In other words, movement of lever arm 42 to the left is translated by means of shaft 41 into an upward force on beams 23 to elevate beams 23 and to releasably support beams 23 with electrode 11 spaced from electrode 12.

The free end of lever arm 42 is connected to a first end of a cable 48 which extends through a sheath 49 for connection to a foot petal 50 pivotally mounted on a base 51. Thus, if an operator steps on foot petal 50, cable 48 is retracted, applying a force to lever arm 42 in the direction of arrow A shown in FIG. 2. This stretches spring 46 and moves lever arm 42 out of contact with shaft 41 so that beams 23 are free to move downwardly.

It is the function of power source 17 to apply an electrical pulse to electrodes 11 and 12. For this purpose, a first electrical connection 52 is made between power source 17 and stationary electrode 12. A second electrical connection 53 is made between power source 17 and support 30 such as by use of a connector sandwiched between bolt 36 and support 30. By making support 30, plates 33, cross members 28, beams 23, plates 24 and housing 21 from electrically conductive, metallic materials, this connection to support member 30 electrically connects power source 17 to electrode 11.

After electrodes 11 and 12 are brought into contact with a terminal with the desired force, power source 17 is signalled to apply the electrical pulse, previously described, to electrodes 11 and 12. This may be accomplished by positioning a switch 54 with its movable arm 55 in the path of lever arm 42. Thus, only when foot petal 50 is depressed to move lever arm 42 by an amount sufficient to release shaft 41 will lever arm 42 contact arm 55 of switch 54 to signal power source 17 over an electrical lead 56 that the electrical pulse may be applied to electrodes 11 and 12.

In operation, spring 46 has a sufficient force to overcome the weight of beams 23 and to normally maintain beams 23 in their elevated positions, with electrodes 11 and 12 sufficiently spaced to permit the positioning of a circuit board 14 therebetween. Thereafter, when the terminal which is to have wire 15 connected thereto is aligned with electrodes 11 and 12, the operator can depress foot petal 50. This rotates lever arm 42, stretching spring 46, moving lever arm 42 to the position shown in phantom in FIG. 4 where it is spaced from shaft 41. This permits beams 23 to move downwardly under the force of gravity. Since the weight of beams 23 and those members connected thereto never changes, the force applied by electrode 11 to the terminal remains unchanged as machine 10 is cycled repeatably. Upon further depression of foot petal 50, switch 54 is activated and power source 17 applies its electrical pulse to electrodes 11 and 12. The electrical pulse causes a diffusion bond to occur at the junction of wire 15 and the terminal.

An advantage derived from the use of dual beams 23 may be seen from an inspection of FIG. 4. That is, because the lateral positions of cross members 28 are unchangeable, because of the solid connections between plates 33 and members 28 and support 30, the opposite ends of beams 23, the ends connected to housing 21, remain vertically aligned as beams 23 pivot. The result is that housing 21 and electrode 11 also retain their vertical orientation and the movement of electrode 11 is a parallel movement rather than a rotational movement. This would obviously not be the case if only a single beam 23 were used.

It can, therefore, be seen that according to the present invention, there is provided a welding machine 10 which solves the problems encountered heretofore with conventional welding machines. According to the present invention, the required force on insulated wire 15 to pierce the insulation and perform the weld is supplied by a dead weight principle, thus eliminating the problems inherent in the use of tension springs, negator springs or pneumatic-actuated devices. With machine 10, there are no sliding surfaces, linear or rotary, nor are there rolling surfaces, there is no need for lubrication, and there is no wear. There is no friction that could add to or subtract from the desired electrode force. There are also no clearances that could allow the movable electrode 11 to wiggle even slightly in the lateral direction.

The advantages of the present design are fully available without the need for precision parts or adjustments. Flexure pivots provide a low resistance path for the welding current to electrode 11 without the need for movable electrode connectors. The applied force is achieved by use of the weight of arms 23. Once set, the arm weight never drifts or changes, eliminating the need to periodic check and adjust the welding force.

While the invention has been described with respect to the preferred physical embodiment constructed in accordance therewith, it will be apparent to those skilled in the art that various modifications and improvements may be made without departing from the scope and spirit of the invention. For example, while machine 10 has been described as including a pair of electrodes 11 and 12 positioned in coaxial, spaced relationship with electrode 11 movable and electrode 12 stationary, it will be obvious to those skilled in the art that electrode 12 can also be movable. Furthermore, electrodes 11 and 12 can be positioned concentrically with a dielectric therebetween. Accordingly, it is to be understood that the invention is not to be limited by the specific illustrative embodiment, but only by the scope of the appended claims.

We claim:

1. A welding machine for welding a conductor to a terminal comprising:
   a stationary support;
   at least one arm having a known weight;
   a flexible plate connected between one end of said arm and said stationary support for pivotally connecting said arm to said stationary support;
   a first conductive electrode mounted on the other end of said arm, said terminal being positionable below said electrode; and means for releasably supporting said arm with said first electrode spaced from said terminal, said supporting means being adapted to release said arm whereby said weight of said arm moves said electrode into contact with said terminal and determines the force therebetween.

2. A welding machine according to claim 1, wherein said arm is a generally T-shaped member having a main elongate section and a cross piece connected to one end of said main section, said first electrode being mounted on the other end of said main section; and further comprising:

a pair of flexible plates connected between the ends of said cross piece and said stationary support.

3. A welding machine according to claim 1 or 2, further comprising:

a housing, said first electrode being mounted within said housing; and a second flexible plate connected between said housing and said other end of said arm.

4. A welding machine for welding a conductor to a terminal comprising:

a stationary support;

first and second elongate arms having known weights;

a plurality of flexible plates connected between first ends of said first and second arms and said stationary support for pivotally connecting said first and second arms to said stationary support with said arms positioned in parallel, spaced, vertically aligned relationship;

an electrode housing;

means for connecting second ends of said first and second arms to said housing;

a first conductive electrode mounted within said housing, said terminal being positionable below said electrode; and means for releasably supporting said arms with said first electrode spaced from said terminal, said supporting means being adapted to release said arms whereby said weight of said arms moves said first electrode into contact with said terminal, said weight of said arms determining the force applied by said first electrode to said terminal.

5. A welding machine according to claim 4, wherein said means for connecting second ends of said first and second arms to said housing comprises:

a pair of flexible plates connected between said second ends of said arms and said housing.

6. A welding machine according to claim 5, wherein said plates are positioned in parallel, vertically spaced, horizontally oriented relationship.

7. A welding machine according to claim 4, wherein each of said arms is a generally T-shaped member having a main elongate section and a cross piece connected to one end of said main section, said housing being connected to the other ends of the main sections of said first and second arms; and wherein a pair of flexible plates are connected between the ends of each of said cross pieces and said stationary support.

8. A welding machine according to claim 4 or 7, wherein said means for connecting second ends of said first and second arms to said housing comprises:

a pair of flexible plates connected between said second ends of said arms and said housing.

* * * * *